(12) United States Patent
Huang

(10) Patent No.: US 8,673,083 B2
(45) Date of Patent: Mar. 18, 2014

(54) METHOD OF CLEANING SHOWERHEAD

(75) Inventor: Jr Yuan Huang, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 612 days.

(21) Appl. No.: 13/033,850

(22) Filed: Feb. 24, 2011

(65) Prior Publication Data

US 2011/0139174 A1 Jun. 16, 2011

Related U.S. Application Data

(63) Continuation-in-part of application No. 12/428,042, filed on Apr. 22, 2009, now abandoned.

(51) Int. Cl.
*B08B 3/12* (2006.01)

(52) U.S. Cl.
USPC .................................................. 134/1; 134/42

(58) Field of Classification Search
USPC ....................................................... 134/1, 42
See application file for complete search history.

(56) References Cited

U.S. PATENT DOCUMENTS

| | | | | |
|---|---|---|---|---|
| 7,247,579 B2 * | 7/2007 | Ren et al. | ...................... | 438/753 |
| 7,578,889 B2 * | 8/2009 | Shih et al. | ...................... | 134/26 |
| 2003/0150476 A1 * | 8/2003 | Suzuki | .............................. | 134/1 |

* cited by examiner

*Primary Examiner* — Saeed T Chaudhry
(74) *Attorney, Agent, or Firm* — Rosenberg, Klein & Lee

(57) ABSTRACT

A showerhead cleaning rack is disclosed. The showerhead cleaning rack includes a frame and a support body, wherein the support body is located and connected with the frame. The support body has a plurality of positioning parts. The positioning parts are used for holding the showerhead. The showerhead cleaning rack is used in an ultrasonic cleaning trough. By utilizing the oscillation of the ultrasonic wave generated in the ultrasonic cleaning trough, the pollutants on the showerhead is cleaned. An ultrasonic cleaning method with the showerhead cleaning rack is also provided.

6 Claims, 7 Drawing Sheets

METHOD OF CLEANING SHOWERHEAD

CROSS REFERENCE TO RELATED APPLICATION

This application is a continuation-in-part of U.S. application Ser. No. 12/428,042 filed on Apr. 22, 2009, now pending.

BACKGROUND OF THE INVENTION

1. Field of the Invention

The present disclosure relates to a method of cleaning showerhead; in particular, the present disclosure relates to method of cleaning showerhead for spraying manufacturing process gas by ultrasonic with a showerhead cleaning rack.

2. Description of Related Art

Integrated circuits usually are manufactured by the deposition processes and the etching processes. The deposition layer is deposited on a working piece. Next, the material of the deposition layer is etched to form a desired pattern. The above manufactured processes are implemented in a vacuum room.

Usually, the chemical reactants for the deposition or etching process includes one or more than one gas (referred to as the manufacturing process gas) and the manufacturing process gas is sprayed in the vacuum room by the showerhead located above the working piece. The manufacturing process gas is sprayed through the small holes located on the surface of the showerhead so as to form the desired manufacturing process gas disposition around the working piece.

When the deposition or etching process is finished, the showerhead needs to be cleaned so as to eliminate the pollutants in the showerhead. Thereby, when the deposition or etching process is performed again, the yield rate of the deposition or etching process will not be affected by the pollutants on the showerhead. Generally, when the showerhead is cleaned, the showerhead is placed in a clean trough that is fully filled with the cleaning agent, and an oscillation method is used to oscillate the cleaning agent so as to clean the pollutants on the showerhead. However, the cleaning method of the prior art cannot fully clean the pollutants. Therefore, the onsite engineer in the semiconductor factory must repeatedly clean the showerhead until the pollutants on the showerhead are fully removed. A lot of cleaning time and manpower are required, thus the production efficiency is affected.

SUMMARY OF THE INVENTION

One aspect of the present disclosure is to provide an ultrasonic cleaning method. The ultrasonic cleaning method forms a standing wave. When the showerhead is exactly located at the location that intersects with the standing wave of the ultrasonic wave, the ultrasonic cleaning method utilizes the energy of the standing wave to forcedly oscillate and clean the pollutants on the showerhead.

The showerhead cleaning rack is installed in an ultrasonic cleaning trough for holding and securing a showerhead. The showerhead cleaning rack includes a frame and at least one support body, wherein the support body is located in the frame and connected with the frame. A plurality of positioning parts with a predetermined height protrudes from the support body. The plurality of positioning parts clamps the showerhead to make the showerhead be located at the predetermined height in the ultrasonic cleaning trough, wherein the predetermined height in the ultrasonic cleaning trough is a location that intersects with the standing wave of an ultrasonic wave. When the ultrasonic cleaning trough generates the ultrasonic wave, the ultrasonic wave oscillates and cleans the pollutants on the showerhead.

In one preferred embodiment, the ultrasonic cleaning trough has an ultrasonic wave generator, and the ultrasonic wave generator generates a plurality of standing waves in the ultrasonic cleaning trough. The frame is located at the ultrasonic wave generator, and the predetermined height of the positioning parts results in the showerhead being located at a location that intersects with the standing waves of an ultrasonic wave formed in the ultrasonic cleaning trough.

In one preferred embodiment, the positioning part is an L-shaped rod that protrudes from the support body, and each of the positioning parts has a supporting portion and a holding portion. The supporting portion is adjacent to the holding portion. The supporting portion contacts one side surface of the showerhead, and the holding portion holds the showerhead. A protection part is located at the positioning part. The protection part is L-shaped and is pasted on the supporting portion and the holding portion so as to prevent the positioning part from scraping the surface of the showerhead.

The present disclosure also provides an ultrasonic cleaning method with the showerhead cleaning rack. The ultrasonic cleaning trough has an ultrasonic wave generator. The ultrasonic cleaning method includes the following steps. A location to be cleaned for the showerhead is determined. The frequency of the ultrasonic wave is determined according to the location to be cleaned. The showerhead is installed at the showerhead cleaning rack and the showerhead is located at a pre-determined height in the ultrasonic cleaning trough. A cleaning agent is added into the ultrasonic cleaning trough, and the ultrasonic wave generator is operated to generate an ultrasonic wave. The ultrasonic wave forms a plurality of standing waves in the cleaning agent. The pre-determined height of the showerhead intersects with the standing waves of the ultrasonic wave. The standing waves oscillate so as to clean the pollutants on the showerhead.

In one preferred embodiment, the cleaning agent is deionized water (DI water), and the standing waves is located at ¼ wavelength and ¾ wavelength of the ultrasonic wave.

The showerhead cleaning rack and the ultrasonic cleaning method with the showerhead cleaning rack have the following characteristics.

The showerhead is installed in the showerhead cleaning rack. The pollutants accumulated on the showerhead can be easily cleaned by the standing waves formed in the ultrasonic cleaning trough. Moreover, by using the showerhead cleaning rack, the showerhead is fastened onto the showerhead cleaning rack when the showerhead is cleaned. Thereby, the showerhead is protected, and the showerhead will not be damaged due to the oscillation generated during the cleaning process.

Furthermore, the present disclosure utilizes the standing waves formed in the ultrasonic cleaning trough to be the cleaning means, and uses the showerhead cleaning rack to secure the showerhead at a location that intersects with the standing waves. By using the strong oscillation energy of the standing waves, the pollutants on the showerhead is fully cleaned.

For further understanding of the present disclosure, reference is made to the following detailed description illustrating the embodiments and examples of the present disclosure. The description is for illustrative purpose only and is not intended to limit the scope of the claim.

BRIEF DESCRIPTION OF THE DRAWINGS

The drawings included herein provide a further understanding of the present disclosure. A brief introduction of the drawings is as follows.

DETAILED DESCRIPTION OF THE PREFERRED EMBODIMENTS

Figure 1:
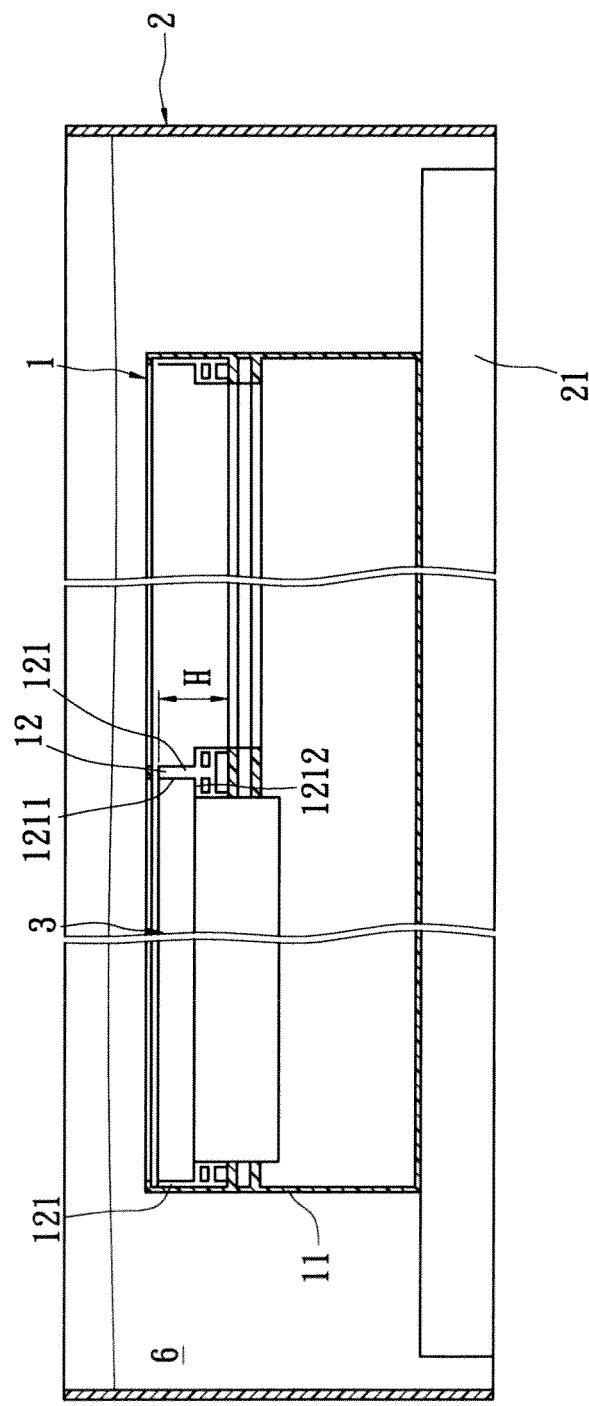
FIG. 1 is a schematic diagram of a showerhead cleaning rack being located in the ultrasonic cleaning trough of the present disclosure.
Figure 2:
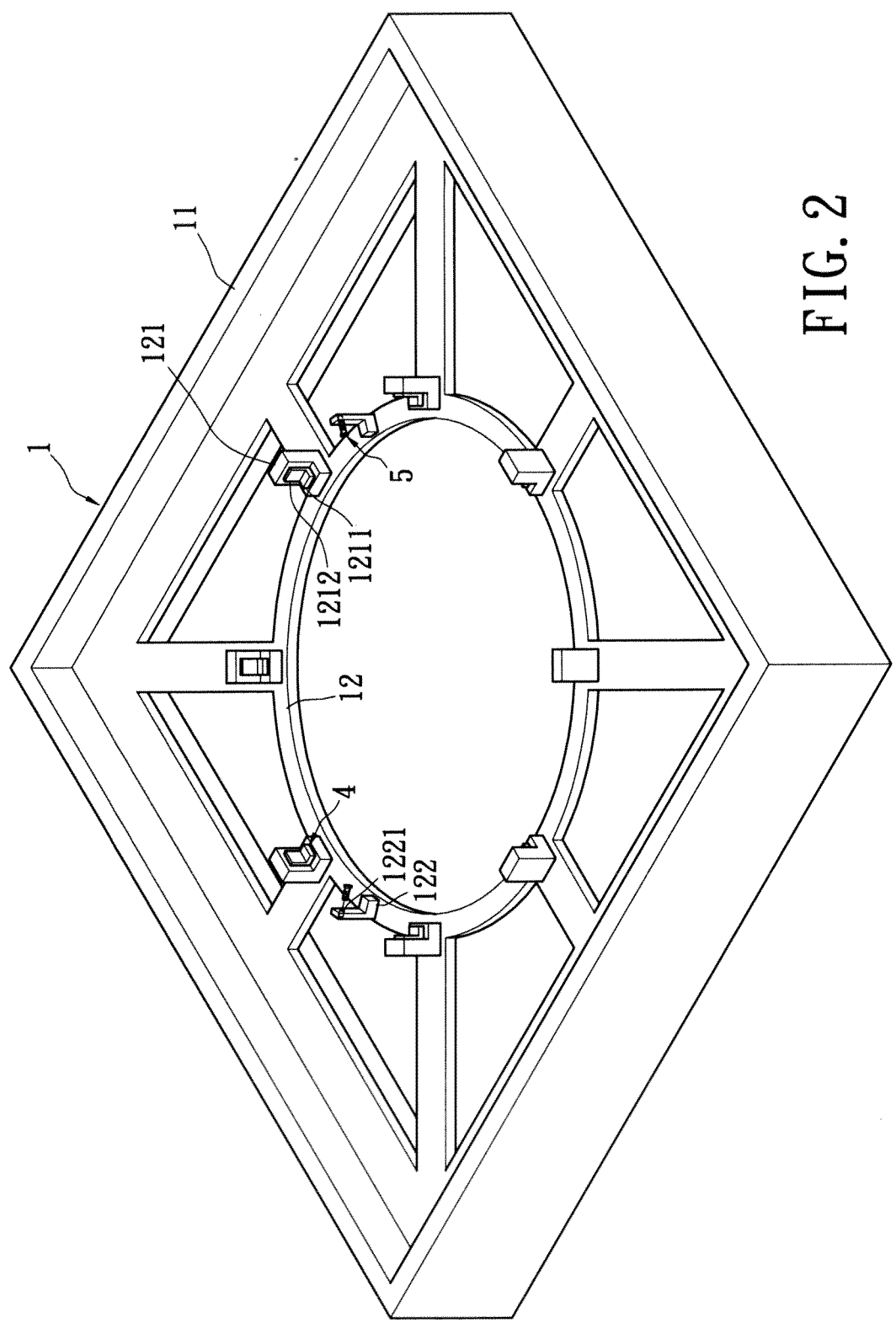
FIG. 2 is a perspective view of the showerhead cleaning rack of the present disclosure.

Reference is made to FIGS. 1 and 2. The present disclosure provides a showerhead cleaning rack. The showerhead cleaning rack 1 is disposed in an ultrasonic cleaning trough 2 for holding and securing a showerhead 3 which is used in semiconductor processing. By performing a cleaning operation on the showerhead 3 in the ultrasonic cleaning trough 2, the pollutants deposited in the showerhead 3 during the semiconductor processing could be cleaned. The showerhead cleaning rack 1 includes a frame 11 and a support body 12 connected with the frame 11. The ultrasonic cleaning trough 2 has an ultrasonic wave generator 21 disposed in the bottom thereof. By generating an ultrasonic wave from the ultrasonic wave generator 21 in the ultrasonic cleaning trough 2, the pollutants in the showerhead 3 could be cleaned more efficiently by oscillation of the ultrasonic wave. In this embodiment, the showerhead 3 could be used in a plasma-enhanced chemical vapor deposition system (PECVD).

The support body 12 is located in the frame 11, and the support body 12 is connected with the frame 11. The connection between the support body 12 and the frame 11 can be integrated into one piece or be independently connected. In this embodiment, the support body 12 has a plurality of arms extended from an outer edge to connect with an inner edge of the frame 11 and is integrated into one piece. The dimension of the support body 12 is smaller than the dimension of the frame 11. The shape of the support body 12 is not limited to a specific one, and can be any shapes, such as circular, square, or irregular. The shape of the support body 12 corresponds to the shape of the showerhead 3. In this embodiment, the shape of the showerhead 3 is circular, and the shape of the support body 12 is also circular.

In order to fasten the showerhead 3, the support body 12 has a plurality of positioning parts 121. The plurality of positioning parts 121 protrude from the support body 12 and are rods. The rods are L-shaped. The showerhead 3 is held by the positioning parts 121, and the showerhead 3 is fastened and thereby secured. Because the positioning part 121 has a pre-determined height H, the showerhead 3 is kept in the pre-determined height at the support body 12 (as shown in FIG. 1) when the showerhead 3 is held by the positioning parts 121. The frame 11 is located above the ultrasonic wave generator 21 in the ultrasonic cleaning trough 2. When the ultrasonic wave generator 21 generates ultrasonic waves, the ultrasonic waves form standing waves in the ultrasonic cleaning trough 2. The pre-determined height H is to make the showerhead 3 be at one antinode of the standing waves of the ultrasonic waves in the ultrasonic cleaning trough 2 by using the positioning parts 121. By utilizing antinodes of the standing waves which has highest amplitude, the pollutants in the showerhead 3 could be cleaned more efficiently.

The positioning part 121 has a support portion 1211 and a holding portion 1212. The support portion 1211 is adjacently connected with and vertical to the holding portion 1212. The support portion 1211 is used for supporting the showerhead 3. The support portion 1211 contacts one side surface of the showerhead 3. The holding portion 1212 is used for securing the showerhead 3. The holding portion 1212 holds around the showerhead 3 (referring to the FIG. 1).

In order to protect the showerhead 3, the positioning part 121 also has a protection part 4. The material of the protection part 4 could be Polytetrafluoroethene (PTFE, or Teflon (trademark)). The shape of the protection part 4 corresponds to the shape of the positioning part 121 and is L-shaped. The protection part 4 is fixed on the support portion 1211 and the holding portion 1212 of the positioning part 121. Thereby, when the showerhead 3 is held on to the positioning parts 121, the protection part 4 prevents the showerhead 3 from being scratched by the positioning parts 121.

The support body 12 further has two position-limiting parts 122. The ultrasonic usually accompanies many bubbles, which may cause a floating force to the showerhead 3. The two position-limiting parts 122 could be used for fastening the showerhead 3 with the positioning parts 121 so as to prevent the showerhead 3 from escaping the positioning parts 121 when the showerhead 3 is cleaning. The two position-limiting parts 122 protrude from the support body 12 and are L-shaped boards. The two position-limiting parts 122 respectively have a screw hole 1221. When the positioning parts 121 are held around the showerhead 3, a screw 5 is locked into the screw holes 1221 of the two position-limiting parts 122 so as to prevent the showerhead 3 from floating. The quantity of the position-limiting part 122 is not limited, and can be one, two, three, or more. In this embodiment, two position-limiting parts 122 are provided.

Figure 3A:
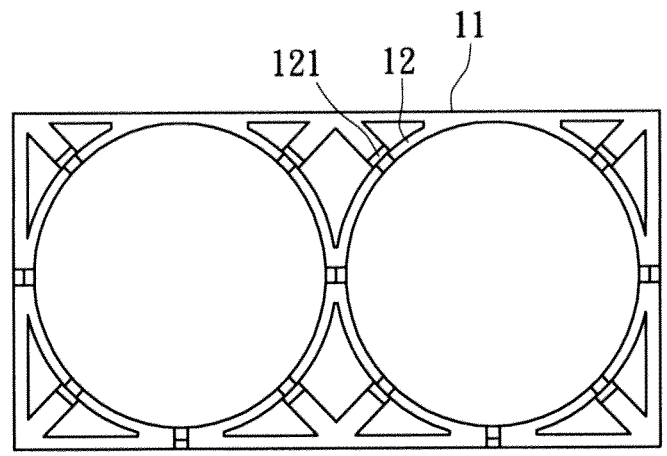
FIG. 3A is a perspective view of the showerhead cleaning rack according to a second embodiment of the present disclosure.
Figure 3B:
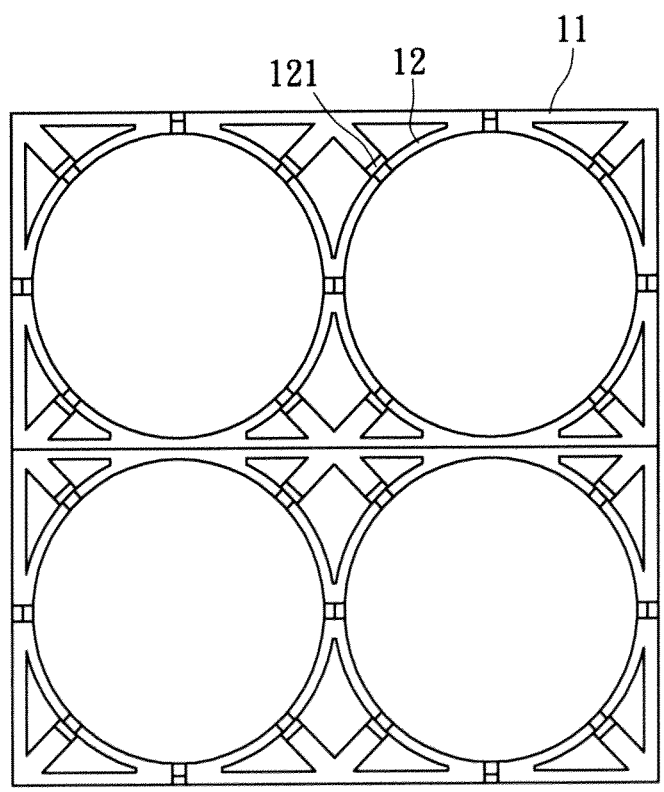
FIG. 3B is a perspective view of the showerhead cleaning rack according to a third embodiment of the present disclosure.

Referring to FIGS. 3A and 3B, the quantity of the support body is also not limited to a specific one, and can be one, two, or more. The frame 11 can be connected with a plurality of support bodies 12, and a plurality of showerheads 3 could be cleaned in once time by the plurality of support bodies 12.

Figure 4:
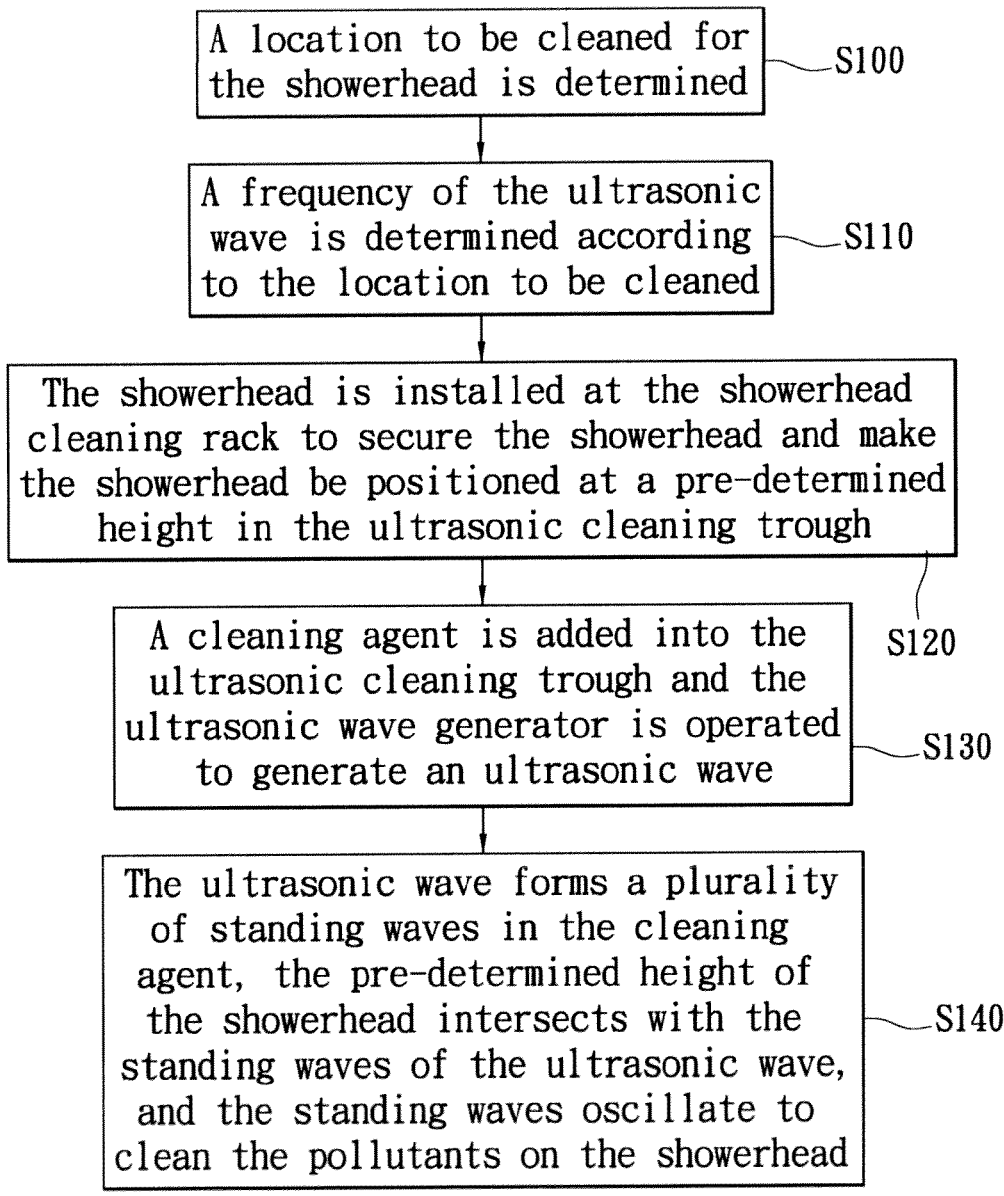
FIG. 4 is a flow chart of the ultrasonic cleaning method of the present disclosure.

Reference is made to FIG. 4, in conjunction to FIGS. 1 and 2, the present disclosure also provides an method of cleaning showerhead. The method is applied in the ultrasonic cleaning trough 2. In the ultrasonic cleaning trough 2, there is an ultrasonic wave generator 21 for generating an ultrasonic wave. The ultrasonic cleaning method includes the following steps.

S100: A location of pollutants deposited in the showerhead 3 to be cleaned is determined. The location of the showerhead 3 to be cleaned is the location of the pollutants deposited at the showerhead 3. The showerhead 3 has a plurality of narrow spraying nozzles with quite-long channels, which should be considered and will be described after.

The showerhead cleaning rack 1 is provided for holding the showerhead 3 in the ultrasonic cleaning trough 2. When putting the showerhead 3 cleaning rack in the ultrasonic cleaning trough 2, the location of pollutants deposited in the showerhead 3 is considered to get a pre-determined height of the location of the pollutants in the ultrasonic cleaning trough 2.

Figure 5:
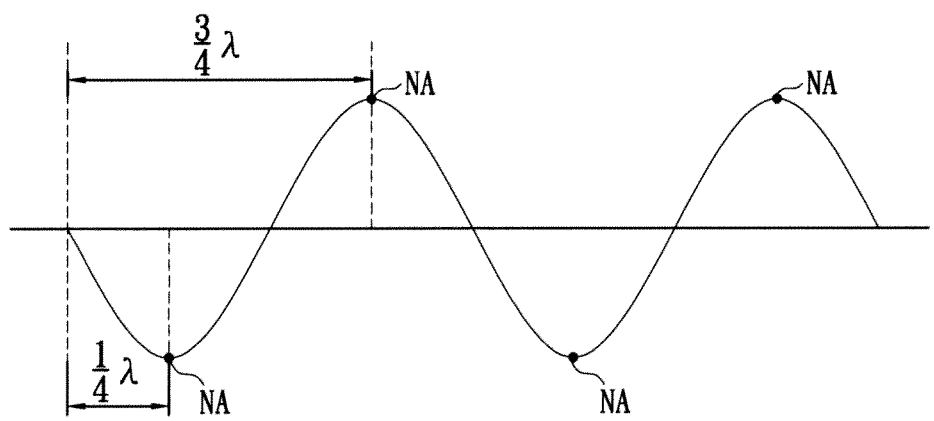
FIG. 5 is a schematic diagram of the wave-form position of a standing wave of the present disclosure.

S110: The frequency of the ultrasonic wave is considered to get the wavelength thereof for matching with the location of the pollutants of the showerhead 3 in the ultrasonic cleaning trough 2, so that the pollutants of the showerhead 3 could be substantially at the position of the antinodes of the ultrasonic wave. The position of the antinodes of the ultrasonic wave is shown as in FIG. 5. The frequency of the ultrasonic wave is not limited to a specific one, and is determined by the location of the pollutants to be cleaned for the showerhead 3. For example, the frequency of the ultrasonic wave could be 20-100 KHZ.

S120: After the frequency of the ultrasonic wave is determined, the showerhead 3 is installed at the showerhead cleaning rack 1 and the pollutants at the showerhead 3 is located at a pre-determined height related to the ultrasonic wave generator 21 in the ultrasonic cleaning trough 2. In other words, the wavelength of the ultrasonic wave could be considered according to the pre-determined height of the pollutants.

S130: A cleaning agent 6 is added into the ultrasonic cleaning trough 2 and the ultrasonic wave generator 21 in the ultrasonic cleaning trough 2 is operated to generate ultrasonic waves. The type of the cleaning agent 6 is not limited to a specific one, and is determined by the user's requirements. In this embodiment, the cleaning agent 6 is deionized water (DI water).

S140: When the ultrasonic wave generator 21 in the ultrasonic cleaning trough 2 is operated to generate ultrasonic waves, the ultrasonic waves form a plurality of standing waves in the cleaning agent 6. The pre-determined height of the pollutants at the showerhead 3 is located at one of the antinodes of the standing waves. The standing waves oscillate to clean the pollutants in the showerhead 3. According to the theory of the standing wave, the standing wave may be located at 1/4, 3/4, 5/4, or 7/4 of the wavelength of the ultrasonic wave.

Figure 6:
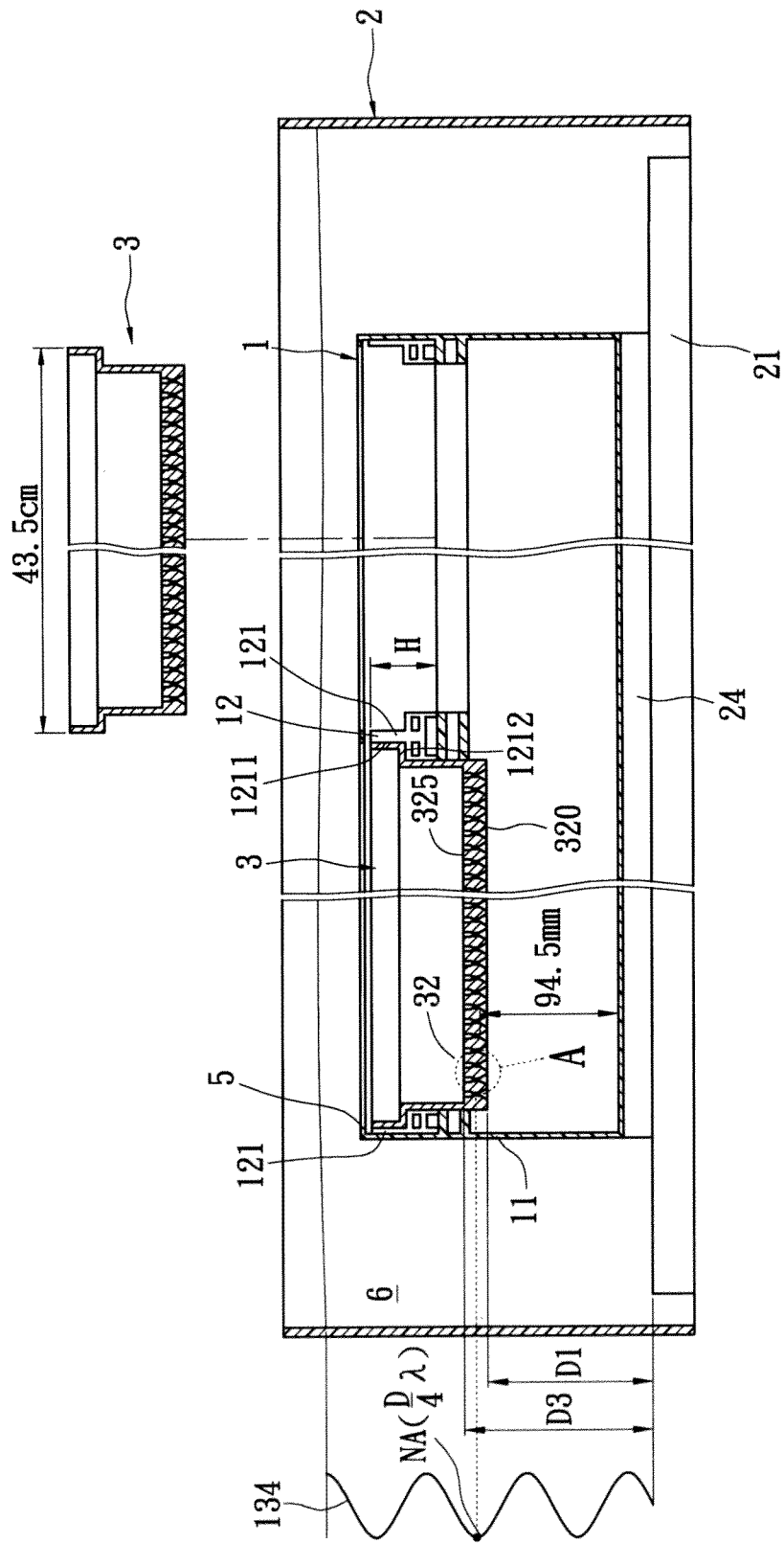
FIG. 6 is a cross-sectional view of showerheads disposed in the showerhead cleaning rack according to this present disclosure.
Figure 6A:
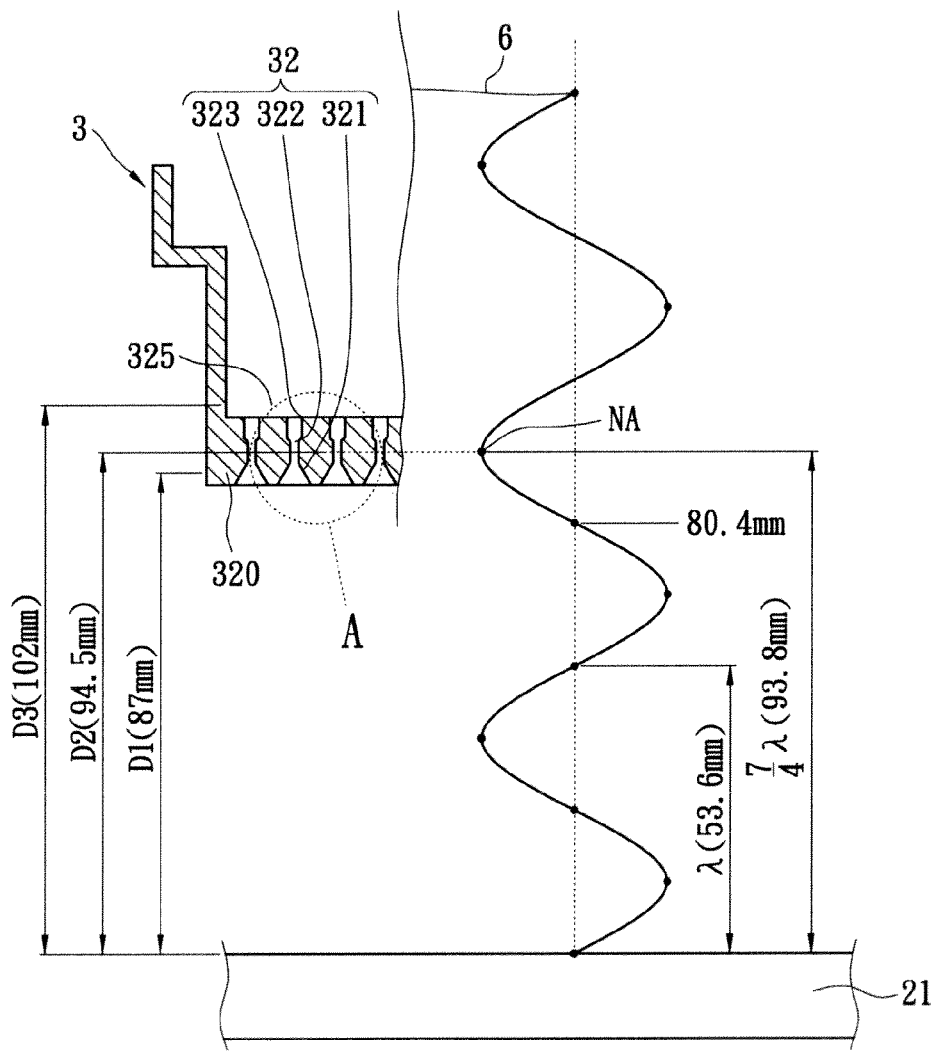
FIG. 6A is an enlarged view of "A" part in FIG. 6.

Reference is made to FIGS. 6 and 6A, a showerhead with an enlarged view of "A" part are illustrated as an embodiment according to this present disclosure. The showerhead 3 is faced down the ultrasonic cleaning trough 2, and has a plurality of spraying nozzles 32. Each spraying nozzles 32 has a horn-portion 321, a throat-portion 322 and a passage-portion 323, which has a substantial equal length. The horn-portion 321 faces the ultrasonic wave generator 21. The throat-portion 322 is extended from the horn-portion 321 and is narrowest in the spraying nozzles 32. The passage-portion 323 is extended from the throat-portion 322. The pollutants are usually deposited in the throat-portion 322, and it is crucial in the cleaning process. The position of the pollutant in the showerhead 3 could be deemed as the central point of the throat-portion 322. In this embodiment, the position of the pollutant in the showerhead 3 is disposed at the 7/4 of the wavelength of the ultrasonic wave.

The above-mentioned position of the pollutants in the showerhead 3 could be determined as the central position of the throat-portion 322. In this embodiment, the frequency of ultrasonic wave is 28 KHZ. The speed of the ultrasonic wave in DI water could be deemed as 1500 m/s, thus a wavelength $\lambda$ of the ultrasonic wave is about 53.6 mm. The antinodes are located at 13.4 mm, 40.2 mm, 67 mm, 93.8 mm, 120.6 mm . . . etc. This present disclosure is to dispose the position of the pollutant in the showerhead 3, which could be deemed as the central point of the throat-portion 322, substantially at the positions listed as above. Thus, the highest amplitude of the ultrasonic wave with a maximum energy is located at the position of the pollutant, the central point of the throat-portion 322, for cleaning the pollutant.

The showerhead cleaning rack and the ultrasonic cleaning method with the showerhead cleaning rack have the following characteristics.

1. By using the showerhead cleaning rack, the pollutants on the showerhead 3 can be easily cleaned by the standing waves formed in the ultrasonic cleaning trough 2.

2. By using the showerhead cleaning rack, the showerhead 3 is fixed and secured at the showerhead cleaning rack 1 so as to prevent the showerhead 3 from being damaged.

3. The ultrasonic cleaning method of the present disclosure forms the standing waves in the ultrasonic cleaning trough 2. By utilizing the standing waves as a cleaning means and using the showerhead cleaning rack 1 so that the showerhead 3 is secured at a location that intersects with the standing waves of the ultrasonic waves, the powerful energy of the standing waves are used for cleaning the pollutants on the showerhead 3.

The description above only illustrates specific embodiments and examples of the present disclosure. The present disclosure should therefore cover various modifications and variations made to the herein-described structure and operations of the present disclosure, provided they fall within the scope of the present disclosure as defined in the following appended claims.

What is claimed is:

1. A method of cleaning showerhead for spraying manufacturing process gas, comprising steps of:
   providing a ultrasonic cleaning trough with an ultrasonic wave generator for generating an ultrasonic wave;
   determining a location of pollutants deposited at the showerhead;
   providing a showerhead cleaning rack for holding the showerhead;
   putting the showerhead cleaning rack in the ultrasonic cleaning trough;
getting a pre-determined height of the location of the pollutants at the showerhead in the ultrasonic cleaning trough;
   determining a frequency of the ultrasonic wave to get the wavelength thereof according to the pre-determined height of the pollutants;
   adding a cleaning agent into the ultrasonic cleaning trough and operating the ultrasonic wave generator; and
   forming a plurality of standing waves in the cleaning agent by the ultrasonic wave, wherein the pre-determined height of the pollutants at the showerhead is located at one of the antinodes of the standing waves, and the standing waves oscillate to clean the pollutants on the showerhead.

2. The method as claimed in claim 1, wherein the cleaning agent is deionized water.

3. The method as claimed in claim 1, wherein the pre-determined height of the pollutants at the showerhead is located at 1/4 or 3/4 wavelength of the standing wave of the ultrasonic wave.

4. The method as claimed in claim 1, wherein the showerhead cleaning rack is movable related to the ultrasonic cleaning trough.

5. The method as claimed in claim 1, wherein the showerhead cleaning rack comprises:
   a frame;
   at least one support body located in the frame and connected with the frame; and
   a plurality of positioning parts protruding from the support body, wherein the plurality of positioning parts clamps the showerhead, and the positioning parts are located at the predetermined height in the ultrasonic cleaning trough.

6. The method as claimed in claim 1, wherein the showerhead comprises a plurality of spraying nozzles, each spraying nozzles has a horn-portion, a throat-portion and a passage-portion, the central point of the throat-portion is disposed substantially at one of antinodes of the ultrasonic wave.

* * * * *